US012637788B2

(12) United States Patent
Kobayashi et al.

(10) Patent No.: US 12,637,788 B2
(45) Date of Patent: May 26, 2026

(54) AIN SINGLE CRYSTAL SUBSTRATE

(71) Applicant: NGK INSULATORS, LTD., Nagoya (JP)

(72) Inventors: Hiroharu Kobayashi, Kasugai (JP); Hirohisa Ogawa, Kitanagoya (JP); Morimichi Watanabe, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 218 days.

(21) Appl. No.: 18/455,054

(22) Filed: Aug. 24, 2023

(65) Prior Publication Data

US 2023/0392290 A1     Dec. 7, 2023

Related U.S. Application Data

(63) Continuation of application No. PCT/JP2022/006185, filed on Feb. 16, 2022.

(30) Foreign Application Priority Data

Mar. 25, 2021    (JP) ................................. 2021-052335

(51) Int. Cl.
| | |
|---|---|
| *C30B 29/40* | (2006.01) |
| *C30B 29/68* | (2006.01) |
| *H10P 14/20* | (2026.01) |
| *H01L 21/02* | (2006.01) |

(52) U.S. Cl.
CPC ............ *C30B 29/403* (2013.01); *C30B 29/68* (2013.01); *H10P 14/2908* (2026.01); *H10P 14/2924* (2026.01); *Y10T 428/2495* (2015.01)

(58) Field of Classification Search
CPC . C30B 29/403; C30B 29/68; H01L 21/02389; H01L 21/02428; Y10T 428/2495
See application file for complete search history.

(56) References Cited

FOREIGN PATENT DOCUMENTS

| | | | |
|---|---|---|---|
| JP | 2008115023 A | * | 5/2008 |
| JP | 2017117972 A | | 6/2017 |
| JP | 201919042 A | | 2/2019 |
| JP | 2019151520 A | * | 9/2019 |

OTHER PUBLICATIONS

[NPL-1] Hayashi et al. (JP 2019-151520 A); Sep. 12, 2019 (European Patent Office machine translation to English). (Year: 2019).*
[NPL-2] Hiramatsu et al. (JP 2008-115023 A); May 22, 2008 (European Patent Office machine translation to English). (Year: 2008).*
International Search Report with English translation issued in corresponding International Application No. PCT/JP2022/006185 date of mailing Apr. 5, 2022 (5 pages).
Written Opinion of International Searching Authority with English translation issued in corresponding International Application No. PCT/JP2022/006185 dated Apr. 5, 2022 (6 pages).

* cited by examiner

*Primary Examiner* — Donald M Flores, Jr.
(74) *Attorney, Agent, or Firm* — FLYNN THIEL, P.C.

(57) ABSTRACT

Provided is an AIN single crystal substrate having a three-layer structure composed of one AIN single crystal as a whole and is classifiable into the first layer, the second layer, and the third layer in this order in the thickness direction in terms of defect density, wherein the second layer has a defect density of 10 times or more the defect density of each of the first layer and the third layer.

7 Claims, 3 Drawing Sheets

AIN single crystal substrate 40

First layer 10

Second layer 20

Third layer 30

AlN single crystal substrate 40

First layer 10

Second layer 20

Third layer 30

AlN SINGLE CRYSTAL SUBSTRATE

CROSS-REFERENCE TO RELATED APPLICATIONS

This application is a continuation application of PCT/JP2022/006185 filed Feb. 16, 2022, which claims priority to Japanese Patent Application No. 2021-052335 filed Mar. 25, 2021, the entire contents all of which are incorporated herein by reference.

BACKGROUND OF THE INVENTION

1. Field of the Invention

The present invention relates to an AlN single crystal substrate.

2. Description of the Related Art

In recent years, aluminum nitride (AlN) single crystals have attracted attention as base substrates for deep ultraviolet light emitting elements using AlN semiconductors. As AlN semiconductors, AlN, AlGaN, and the like are used, for example. Since these have a direct transition band structure, they are suitable for light emitting devices and can be applied to LEDs (Light Emitting Diodes) and LDs (Laser Diodes) in the deep ultraviolet region.

However, in the case where there are many defects in a base substrate for growing an AlN semiconductor film, the luminous efficiency of the deep ultraviolet light emitting element fabricated using this is reduced, and the lifetime is also shortened. Therefore, there is a need for a base substrate having a surface with low defect density.

Then, an AlN substrate with low defect density is being developed as a base substrate. For example, Patent Literature 1 (JP2019-19042A) discloses a method for producing an AlN single crystal in which an AlN single crystal is grown on a seed substrate in at least two steps using sublimation or the like. Growing the AlN in two steps suppresses the propagation of dislocations in the thickness direction of crystal growth and allows an AlN single crystal with low dislocation density of the surface to be produced. Further, Patent Literature 2 (JP2017-117972A) discloses an AlN single crystal laminate having the front and back surfaces that are Al polar faces and both have a dislocation density of $10^6$ cm$^{-2}$ or less. The AlN single crystal laminate is produced according to the HVPE method (hydride vapor phase epitaxy method) by forming an AlN single crystal layer on an N-polar face of an AlN single crystal substrate produced by sublimation. The fact that there are many defects means that there are many dislocations.

CITATION LIST

Patent Literature

Patent Literature 1: JP2019-19042A
Patent Literature 2: JP2017-117972A

SUMMARY OF THE INVENTION

However, cracks are likely to occur in the AlN single crystal substrate, for example, in the post-process, in the techniques of reducing dislocations (that is, reducing defects), as disclosed in Patent Literature 1 and Patent Literature 2. Here, the "post-process" generally refers to steps such as slicing, cutting, dicing, grinding, and polishing the face to be used for epitaxially growing a semiconductor film for deep ultraviolet light emitting elements, so that a desired semiconductor film is obtained and includes a step of actually fabricating a deep ultraviolet light emitting element. A deep ultraviolet light emitting element fabricated by using such a substrate has poor yield and reduced luminous efficiency. Specifically, the dislocation density increases in the thickness direction of the AlN crystal growth in Patent Literature 1, as shown in FIG. 6 of this literature. It is considered that, although the dislocation density is low near the front surface of the AlN single crystal, the dislocation density is high in the inside and back surface thereof. It is inferred that cracks are likely to occur in the AlN single crystal in the case of such a distribution of dislocations. In Patent Literature 2, the dislocation densities of the front surface 7, the inside (N-polar face 6), and the back surface (Al polar face 5) of the AlN single crystal laminate 1 are respectively $7 \times 10^4$ cm$^{-2}$, $6 \times 10^4$ cm$^{-2}$, and $6 \times 10^4$ cm$^{-2}$, for example, in Example 1 (paragraphs 0078 and 0089). In this way, it is inferred that cracks are more likely to occur in the case where the front surface, the inside, and the back surface of the AlN single crystal laminate all have almost the same small number of defects. Accordingly, it is desired to suppress cracks occurring in AlN single crystal substrates by controlling the number of defects and their distribution in AlN single crystal substrates used for deep ultraviolet light emitting elements.

The inventors have now found that cracks occurring in AlN single crystal substrates can be suppressed by adopting an AlN single crystal substrate in which the defect density of the inside is higher than the defect density of each of the front and back surfaces.

Accordingly, it is an object of the present invention to provide an AlN single crystal substrate in which the occurrence of cracks is suppressed.

According to an aspect of the present invention, there is provided an AlN single crystal substrate that has a three-layer structure composed of one AlN single crystal as a whole and that is classifiable into the first layer, the second layer, and the third layer in this order in a thickness direction in terms of defect density, wherein the second layer has a defect density of 10 times or more the defect density of each of the first layer and the third layer.

DETAILED DESCRIPTION OF THE INVENTION

AlN Single Crystal Substrate

Figure 1:
FIG. 1 is a schematic sectional view showing an example of an AlN single crystal substrate.

The AlN single crystal substrate according to the present invention is an AlN single crystal substrate that has a three-layer structure composed of one AlN single crystal as a whole and that is classifiable into a first layer, a second layer, and a third layer in this order in the thickness direction in terms of defect density. The second layer has a defect density that is 10 times or more the defect density of each of the first layer and the third layer. The inside (second layer) having a defect density higher than the defect density of each of the front surface (first layer) and the back surface (third layer) this way can suppress cracks occurring in an AlN single crystal substrate. Then, deep ultraviolet light emitting elements using such an AlN single crystal substrate can have improved yield and luminous efficiency.

Here, the "AlN single crystal substrate that has a three-layer structure composed of one AlN single crystal as a whole and that is classifiable into a first layer, a second layer, and a third layer in this order in the thickness direction in terms of defect density" refers to an AlN single crystal substrate that can be expediently or conceptually classified into three layers of a first layer, a second layer, and a third layer (they may be referred to as three layer regions of a first region, a second region, and a third region, as required) in terms of the degree of defect density measured by a known method, though it is a single crystal that is difficult to recognize that it is divided into the three layers by cross-sectional observation. Further, it is an AlN single crystal substrate that can be classified into three layers according to the degree of defect density but has no grain boundary between the layers and can be identified as one single crystal including the three layers. At this time, the second layer is no more than a layer between the first layer and the third layer; for example, it is possible that the second layer is not located at a depth near the center of the AlN single crystal substrate but is located away from the third layer and near the first layer, and vice versa. The thickness of the second layer also may be as thin as about 10% of the thickness of the entire AlN single crystal substrate. Also, the AlN single crystal substrate can be classified into three layers according to the degree of defect density by measuring the AlN single crystal substrate, as follows. For example, the AlN single crystal substrate is measured for the defect density in the thickness direction by X-ray topography measurement, TEM observation, etch pit evaluation, or the like and can be classified into the layers (first layer/second layer/third layer). Specifically, after the defect density of the surface of the AlN single crystal substrate is measured, the single crystal substrate is polished for every predetermined thickness (for example, every $\frac{1}{10}$ of the thickness of the single crystal substrate, or 30 $\mu$m), and the operation to measure the defect density of the surface that has appeared by polishing is repeated, to obtain the distribution of the defect density in the thickness direction. Then, the region from the surface with the highest defect density inside the AlN single crystal to the surface with a defect density that is $\frac{1}{10}$ or less of the defect density in the thickness direction is defined as the second layer, and the boundary between the first layer and the second layer and the boundary between the second layer and the third layer are specified. Thus, the AlN single crystal substrate can be classified into the layers (first layer/second layer/third layer). At this time, the defect density of each of the first layer and the third layer means the density of defects reaching the surface of each of the first layer and the third layer opposed to the second layer, and the defect density of the second layer means the highest defect density in the distribution of the defect densities inside the AlN single crystal. The defect density of each of the first layer and the third layer (the defect density reaching each of the front and back surfaces of the AlN single crystal) is $\frac{1}{10}$ or less of the defect density of the second layer (the maximum defect density inside the AlN single crystal that is measured by the aforementioned technique).

As mentioned above, an AlN single crystal is known as a base substrate for deep ultraviolet light emitting elements, an AlN single crystal with low defect density has been developed, as disclosed, for example, in Patent Literature 1. However, the AlN single crystal substrate is likely to crack in the conventional technique, the yield of the deep ultraviolet light emitting elements produced using such a substrate is poor, and the luminous efficiency is also reduced. This is probably because the defect density is low in the front surface of the AlN single crystal, while it is high inside and in the back surface, for example, in Patent Literature 1, so that the distribution of defects is vertically asymmetrical, and the AlN single crystal tends to be strained. In Patent Literature 2, since the defect density is similarly low on the front surface, inside, and back surface of the AlN single crystal laminate, it is considered that there is no portion with many defects anywhere. In this regard, according to the present invention, cracks occurring in the AlN single crystal substrate can be suppressed by controlling the number of defects and their distribution in the AlN single crystal substrate. In particular, the distribution of defects becomes vertically symmetrical and the strain is reduced by providing an AlN single crystal substrate in which the defect density of the inside is higher than the defect density of each of the front and back surfaces, so that the cracks occurring in the AlN single crystal substrate can be suppressed.

The thickness of the entire AlN single crystal substrate is not specifically limited, as long as the defect density of the inside is higher than the defect density of each of the front and back surfaces, and a substrate having a three-layer structure composed of one AlN single crystal as a whole is obtained but is typically 250 to 1500 $\mu$m, more typically 400 to 1500 $\mu$m.

The first layer, the second layer, and the third layer constituting the AlN single crystal substrate are composed of an AlN single crystal and can be said to be an oriented layer. The AlN single crystal in the present invention refers to those oriented in both the c-axis direction and the a-axis direction and includes mosaic crystals. Mosaic crystals are aggregates of crystals that do not have distinct grain boundaries but have crystal orientations that are slightly different from one or both of the c-axis and a-axis. Such an oriented layer has a configuration in which crystal orientations are substantially aligned in the substantially normal direction (c-axis direction) and the in-plane direction (a-axis direction). With such a configuration, it is possible to form a semiconductor layer having excellent quality, particularly excellent orientation, thereon. That is, when the semiconductor layer is formed on the oriented layer, the crystal orientation of the semiconductor layer generally follows the crystal orientation of the oriented layer. Accordingly, the semiconductor film can be formed on the AlN single crystal substrate as an oriented film.

As mentioned above, the AlN single crystal substrate according to the present invention is an AlN single crystal substrate that has a three-layer structure composed of one AlN single crystal as a whole and that is classifiable into the first layer, the second layer, and the third layer in this order in the thickness direction in terms of defect density. FIG. 1 shows an example of this AlN single crystal substrate. The AlN single crystal substrate 40 of this embodiment comprises a first layer 10, a second layer 20, and a third layer 30. The first layer 10, the second layer 20, and the third layer 30 are layers composed of an AlN single crystal and their off angle is preferably 0.0 to 4° from the [0001] axis, more preferably 0.2 to 2° from the [0001] axis. The first layer 10 is provided on one face of the second layer 20, and the third layer 30 provided on a face of the second layer 20 opposed to the first layer 10.

The AlN crystal of the first layer 10, the second layer 20, and the third layer 30 is oriented in both the c-axis direction and the a-axis direction. The orientation evaluation method is not specifically limited, but a known analytical method such as an EBSD (Electron Back Scatter Diffraction Patterns) method or an X-ray pole figure can be used, for example. For example, in the case of using an EBSD method, inverse pole figure mapping and crystal orientation mapping of the surface (plate face) or a cross section orthogonal to the plate face of the AlN single crystal layer are measured. In the inverse pole figure mapping obtained, it can be defined as being oriented in the two axes of the substantially normal direction and the substantially plate plane direction when four conditions are satisfied: (A) when oriented in a specific orientation (first axis) of the substantially normal direction of the plate face, (B) when oriented in a specific orientation (second axis) of the substantially plate in-plane direction orthogonal to the first axis, in the crystal orientation mapping obtained, (C) when the inclination angle from the first axis is distributed within $\pm 10°$, and (D) when the inclination angle from the second axis is distributed within $\pm 10°$. In other words, it can be determined to be oriented in the two axes of the c-axis and the a-axis when the aforementioned four conditions are satisfied. For example, when the substantially normal direction of the plate face is oriented in the c-axis, the substantially plate in-plane direction may be oriented in a specific orientation orthogonal to the c-axis (for example, a-axis). The AlN single crystal may be oriented in two axes of the substantially normal direction and the substantially plate in-plane direction, but it is preferable that the substantially normal direction is oriented in the c-axis. The smaller the inclination angle distribution in the substantially normal direction and/or the substantially plate in-plane direction, the smaller the mosaicity of the AlN single crystal. The closer to zero, the closer to a perfect single crystal. Therefore, in view of the crystallinity of the AlN single crystal, the inclination angle distribution is preferably smaller in both the substantially normal direction and the substantially plate plane direction, and is preferably $\pm 5°$ or less, further preferably $\pm 3°$ or less, for example.

The second layer 20 has a defect density that is 10 times or more the defect density of each of the first layer 10 and the third layer 30. As mentioned above, the defect density of the second layer 20 is the highest defect density inside the AlN single crystal substrate, and the defect density of each of the first layer 10 and the third layer 30 refers to the defect density of each of the first layer 10 and the third layer 30 reaching the surface opposed to the second layer 20 (in other words, the front and back surfaces of the AlN single crystal substrate). The defect density of the second layer 20 is preferably 100 times or more, more preferably 1000 times or more, further preferably 100000 times or more the defect density of each of the first layer 10 and the third layer 30. The upper limit of this value is not specifically limited since it may be such that the defect density of the inside of the AlN single crystal substrate is higher than the defect density of each of the front and back surfaces but is typically 1000000000 times or less. Within such a range, cracks occurring in the AlN single crystal substrate can be suppressed more effectively.

The defect density of each of the first layer 10, the second layer 20, and the third layer 30 can be evaluated by the following known method. Examples of the evaluation method include X-ray topography measurement, etch pit evaluation using KOH melt etching, TEM observation, and combinations of thereof. For example, in the case of evaluating the defect density of each of the first layer 10 and the third layer 30 using X-ray topography, it may be measured from the front and back surfaces of the AlN single crystal substrate. Further, the single crystal substrate may be polished to every predetermined thickness (for example, $\frac{1}{10}$ of the thickness of the single crystal substrate or 30 μm), and the defect density of the surface that has appeared by polishing may be repeatedly subjected to etch pit evaluation using KOH melt etching, to use the highest defect density as the defect density of the second layer 20. Further, the AlN single crystal substrate can be classified into the layers (first layer/second layer/third layer) by defining as a second layer a region in the thickness direction from a surface with the highest defect density inside the AlN single crystal to a surface with a defect density of $\frac{1}{10}$ or less of the defect density based on the distribution of defect densities obtained by such operations in the thickness direction and specifying the boundary between the first layer and the second layer and the boundary between the second layer and the third layer. In other words, the defect density in the second layer 20 can be said to be 10 times or more the defect density reaching the surfaces of the first layer 10 and the third layer 30 on any surface. The defect densities in the layers are not necessarily uniform in the thickness direction and may have a distribution as long as the aforementioned defect density numerical range is satisfied. Further, the defect density is preferably measured in the entire region of the surface exposed by polishing by every predetermined thickness as mentioned above and can be measured by reflection X-ray topography or etch pit evaluation using KOH melt etching. In etch pit evaluation, the surface after etching can be measured with an optical microscope, a laser microscope, SEM, or the like, to measure the etch pit density. However, in the case of carrying out etch pit evaluation using KOH melt etching, the N face that serves as the surface of the first layer or the third layer has lower chemical resistance than the Al face opposed thereto, resulting in a failure of etch pit evaluation. Therefore, in the case of calculating the defect density of the N face by etch pit evaluation, the sample is processed so that the surface located at 30 μm from the N face is exposed, the Al face at the surface is subjected to etch pit evaluation, and the results obtained can substitute for the defect density reaching the surface of the first layer or the third layer. The range of defect densities applicable to the defect evaluation technique is limited, and when the defect density is high, it is preferably evaluated by TEM observation. In TEM observation, since it is difficult to measure the entire region of the surface, defects can be evaluated by sampling a 50 μm×50 μm region including the area from the surface exposed by polishing to the center of gravity of the AlN single crystal substrate and measurement with a TEM. Also in this case, it is preferable to have a plurality of measurement points. For example, similar sampling is performed in four areas, in addition to the 50 μm×50 μm region including the center of gravity, and the average of the defect densities of the five areas in total may be used as the final defect density. Such defect density distribution measurement technique is not specifically limited, and X-ray topography may be used to measure a tomographic topograph, or section X-ray topography may be used to measure the defect density distribution inside the AlN single crystal substrate, for example. In this description, defects include threading screw dislocations (TSD), threading edge dislocations (TED), basal plane dislocations (BPD), and mixed dislocations. Threading means that the dislocation lines are substantially parallel to the

[0001] axis of the hexagonal crystal system. The basal plane means that the dislocation lines lie in the basal hexagonal crystal system (0001) plane.

The second layer 20 preferably has a ratio of the thickness of the second layer 20 to the thickness of the AlN single crystal substrate of 0.02 to 0.28, more preferably 0.02 to 0.18, further preferably 0.04 to 0.18. Further, the thickness of the second layer is preferably 1.0 to 200 μm, more preferably 10 to 150 μm, further preferably 30 to 100 μm. Within such a range, cracks occurring in the AlN single crystal substrate can be suppressed more effectively.

Each of the first layer 10 and the third layer 30 preferably has a defect density of $1.0 \times 10^5/cm^2$ or less, more preferably $1.0 \times 10^4/cm^2$ or less. The lower the defect density of each of the first layer 10 and the third layer 30, the better it is. Therefore, the lower limit may be 0 and is not specifically limited but is typically $1.0/cm^2$ or more. Within such a range, the defect density and the defect distribution are controlled so that the defect density inside the AlN single crystal substrate is higher than the defect density of each of the front and back surfaces, cracks occurring in the AlN single crystal substrate can be suppressed more effectively.

The arithmetic mean roughness Ra on the surface of the first layer 10 and/or the third layer 30 is preferably 1 nm or less, more preferably 0.5 nm or less, further preferably 0.2 nm or less. The crystallinity of the semiconductor layer provided thereon is considered to be more improved by smoothing the surface of the oriented layer in this way.

One side of the AlN single crystal substrate preferably has an area of $20 \, cm^2$ or more, more preferably $70 \, cm^2$ or more, further preferably $170 \, cm^2$ or more. The increase in area of the AlN single crystal substrate enables the area of the semiconductor layer to be formed thereon to be increased. Accordingly, it is made possible to obtain a large number of semiconductor devices from one semiconductor layer, so that the production cost is expected to be reduced. The upper limit of the size is not specifically limited but is typically $710 \, cm^2$ or less on one side.

Production Method

The AlN single crystal substrate of the present invention can be produced by various production methods. For example, it can be preferably produced by performing (a) a step of forming an oriented precursor layer, (b) a step of performing heat treatment, and (c) a step of exposing a surface of the oriented layer by applying a process such as grinding and polishing, as required, and (d) repeating at least one step selected from the aforementioned steps (a) to (c). Here, the oriented precursor layer serves as the AlN single crystal by b) heat treatment step and may contain other components such as dopants. Hereinafter, the production processes of the AlN single crystal substrate will be described with reference to FIG. 2, but the production processes of the AlN single crystal substrate of the present invention are not specifically limited to these production processes, and it can be produced using known methods.

Figure 2:
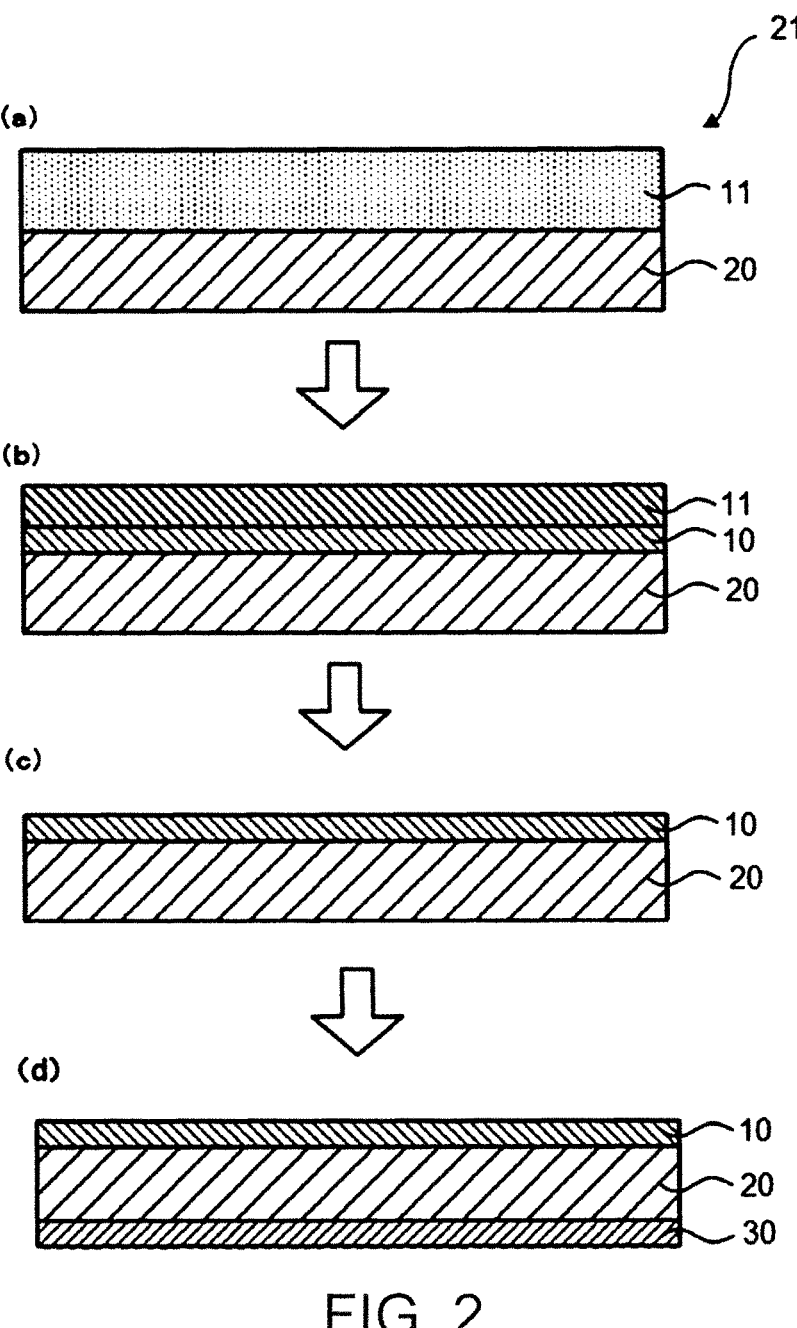
FIG. 2 is a sectional view showing a step of forming the AlN single crystal substrate.

Production Process (See FIG. 2)

In FIG. 2, an AlN single crystal is prepared as the second layer 20, an oriented precursor layer 11 is formed on one surface of the second layer 20 (see FIG. 2(a)), then the first layer 10 is formed by a heat treatment step (see FIG. 2(b)), an oriented precursor layer (not shown) is formed on a surface of the second layer 20 opposed to the first layer, and then the oriented precursor layer is formed into the third layer 30 by a heat treatment step (see FIG. 2(d)), to produce an AlN single crystal substrate. The production process of a c-axis-oriented AlN single crystal substrate will be described below, but the plane orientation is not limited and may be the a-axis orientation or the r-axis orientation.

(a) Step of Forming Oriented Precursor Layer (See FIG. 2(a))

In the step of forming an oriented precursor layer, a c-axis-oriented AlN single crystal 20 that will eventually become the second layer 20 is prepared, and the oriented precursor layer 11 is formed on one surface (for example, Al face) of the AlN single crystal 20, to obtain a laminate 21. The method for forming the oriented precursor layer 11 may be a known method. Examples thereof include solid phase deposition methods such as the AD (aerosol deposition) method and the HPPD (hypersonic plasma particle deposition) method, vapor phase deposition methods such as sputtering, vapor deposition, sublimation, various CVD (chemical vapor deposition) methods, the HVPE method, the MBE method, and the PLD method, liquid phase deposition methods such as the solution growth method (for example, flux method), and a technique of forming an oriented precursor layer directly on the AlN single crystal 20 can be used. As a CVD method, the thermal CVD method, the plasma CVD method, the mist CVD method, the MO (metal organic) CVD method, or the like can be used, for example. Further, a method of placing the oriented precursor layer 11 on the AlN single crystal 20 using a polycrystal produced in advance by a sublimation method, various CVD methods, sintering, or the like can also be used. Alternatively, a technique of producing a formed body of the oriented precursor layer 11 in advance and placing the formed body on the AlN single crystal 20 may be employed. Such an oriented precursor layer may be a tape molded body produced by tape molding or may be a green compact produced by pressure molding such as uniaxial press.

In the case of using sputtering, sublimation, the HVPE method, various CVD methods, the MBE method, the PLD method, the solution growth method, or the like, in the technique of forming the oriented precursor layer 11 on the AlN single crystal 20, epitaxial growth may occur on the AlN single crystal 20 without undergoing the (b) heat treatment step depending on the conditions, and the first layer 10 may be formed. For example, the (a) step for forming oriented precursor layer and the (b) heat treatment step can be combined by using sublimation. That is, since sublimation is performed at high temperature, the heat can be used to form the oriented precursor layer and generate a single crystal layer from the oriented precursor layer simultaneously.

The oriented precursor layer can be produced by molding the raw material powder of the oriented precursor, for example, when using a pre-fabricated formed body as the oriented precursor layer. For example, in the case of using press molding, the oriented precursor layer is a press molded body. The press molded body can be fabricated by press molding the raw material powder of the oriented precursor based on a known method. For example, the raw material powder may be put into a mold and may be fabricated by pressing it at a pressure of preferably 100 to 400 kgf/cm², more preferably 150 to 300 kgf/cm². Further, the molding method is not specifically limited, and tape molding, extrusion molding, cast molding, the doctor blade method, and any combination of these can be used other than press molding. For example, in the case of using tape molding, it is preferable that an additive such as a binder, a plasticizer, a dispersant, or a dispersion medium is appropriately added to the raw material powder to be a slurry, and the slurry is passed through a thin outlet in the form of a slit, so as to be discharged and molded into a sheet. The thickness of the formed body molded into a sheet is not limited but is preferably 5 to 500 μm in view of handling. Further, in the case where a thick oriented precursor layer is necessary, multiple sheet formed bodies may be stacked to a desired thickness for use. Some of the formed bodies near the AlN single crystal will turn into the AlN single crystal layer (for example, the first layer 10) by heat treatment on the AlN single crystal 20. In such a technique, the formed bodies need to be sintered in the later-described heat treatment step. It is preferable that the formed bodies are sintered, after having undergone a step of being integrated with the AlN single crystal layer 20, for example, as a polycrystal, and they form the first layer 10. In the case where the formed bodies do not undergo the state of being sintered, epitaxial growth using the AlN single crystal as a seed may not occur sufficiently. Therefore, the formed bodies may contain additives such as a sintering aid other than the AlN raw material. However, in the technique using a polycrystal fabricated in advance as the oriented precursor layer, it is preferable to take measures such as sufficiently smoothing the surface of the polycrystal for enhancing the adhesion between the polycrystal and the AlN single crystal 20.

However, a method of directly forming the oriented precursor layer using vapor deposition method, particularly, sublimation, the HVPE method, or the MOCVD method is preferably employed. A film can be formed at high speed by using such a method. As mentioned above, epitaxial growth may occur on the AlN single crystal 20 without undergoing the (b) heat treatment step depending on the conditions, and the first layer 10 may be formed. For example, sublimation is the most studied technique for growing bulk AlN that enables the AlN single crystal substrate to be fabricated. In this technique, an AlN single crystal can be formed by decomposing and sublimating high-purity AlN crystal powder charged in a crucible at high temperature and recrystallizing it by supersaturating it at a relatively low-temperature portion. Meanwhile, it is also possible to form a low oriented or non-oriented oriented precursor layer by controlling the film-forming temperature and the film-forming speed.

Known conditions can be used for any of the solid phase deposition, vapor phase deposition, and liquid phase deposition described above, and a technique of directly forming the oriented precursor layer using sublimation will be described below.

Figure 3:
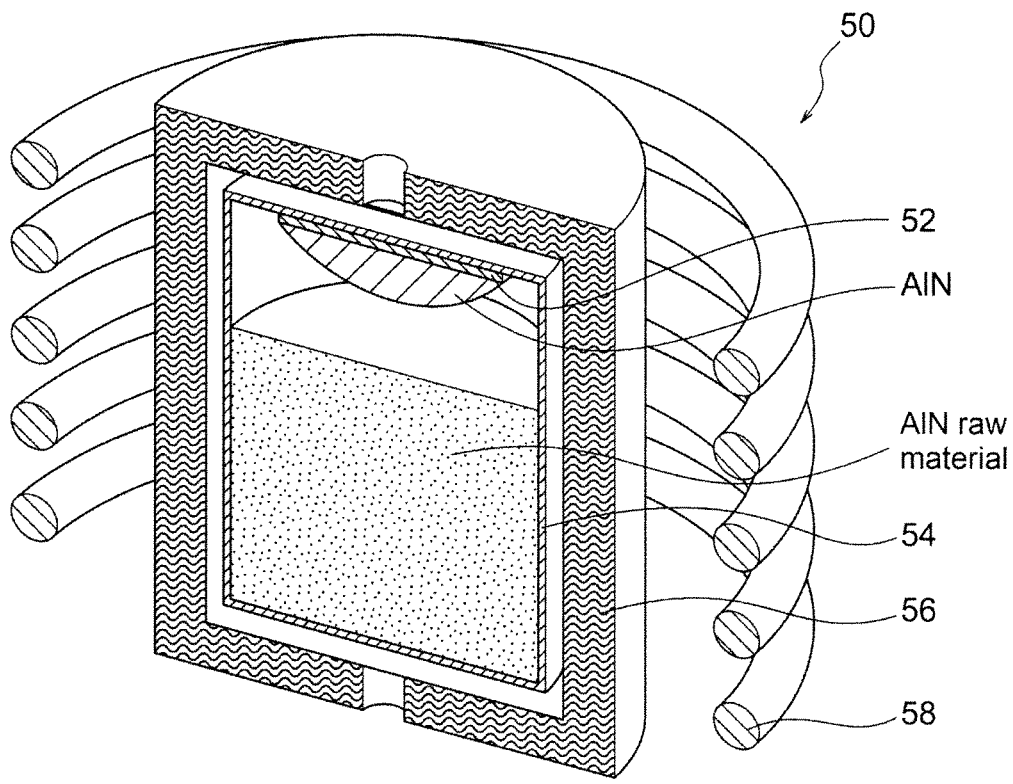
FIG. 3 is a schematic sectional view showing an example of a configuration of a crystal growth apparatus used for sublimation.

FIG. 3 shows an example of a crystal growth apparatus used in sublimation. The film deposition apparatus 50 shown in FIG. 3 includes a crucible 54, a heat insulator 56 for heat insulating the crucible 54, and a coil 58 configured to heat the crucible 54 to high temperature. The crucible 54 contains raw material powder AlN in its lower part and includes a substrate 52 (in this case, the AlN single crystal 20) in its upper part on which the sublimate of the AlN raw material powder is deposited.

The interior of the crucible 54 is pressurized in an $N_2$ atmosphere, and the crucible 54 is heated by the coil 58 to sublimate the AlN raw material powder. The pressure is preferably 10 to 100 kPa, more preferably 20 to 90 kPa. At this time, a temperature gradient is provided so that the temperature near the substrate 52 in the upper part of the crucible 54 is lower than the temperature near the AlN raw material powder in the lower part of the crucible 54. For example, the part of the crucible 54 near the AlN raw material powder is preferably heated to 1900 to 2250° C., more preferably 2000 to 2200° C., and the part of the crucible 54 near the substrate 52 is preferably heated to 1400 to 2150° C., more preferably 1500 to 2050° C. At this time, the temperature of the part near the substrate 52 is preferably set lower by 100 to 500° C., more preferably 200 to 400° C., with respect to that of the part near the AlN raw material powder. The heating is preferably maintained for 2 to 100 hours, more preferably 4 to 90 hours. The temperature can be managed by measuring the temperature of the upper and lower parts of the crucible 54 via the hole of the heat insulator 56 covering the crucible 54 with a radiation thermometer (not shown) and feeding it back to the temperature adjustment. Thus, the AlN single crystal 20 can be disposed as the substrate 52, and AlN is reprecipitated on the surface to form an oriented precursor layer or a single crystal layer.

(b) Heat Treatment Step (See FIG. 2(*b*))

In the heat treatment step, the first layer 10 that is an AlN single crystal layer is produced by heat-treating the laminate 21 with the oriented precursor layer 11 laminated or placed on the AlN single crystal 20. The heat treatment method is not specifically limited, as long as epitaxial growth occurs using the AlN single crystal 20 as a seed, and it can be performed in a known heat treatment furnace such as a tubular furnace or a hot plate. Further, in addition to these heat treatments at normal pressure (pressless), pressure heat treatments such as hot pressing and HIP, and combinations of normal pressure heat treatments and pressure heat treatments can also be used. The heat treatment atmosphere can be selected from vacuum, nitrogen, and inert gas atmospheres. The heat treatment temperature is preferably 1700 to 2400° C. When the heat treatment temperature is high, the oriented precursor layer 11 is easily grown while being oriented along the c-axis and the a-axis, for example, using the AlN single crystal layer 20 as a seed crystal. Accordingly, the heat treatment temperature is preferably 1700° C. or more, more preferably 1850° C. or more, further preferably 2000° C. or more. Meanwhile, when the heat treatment temperature is excessively high, a part of AlN may be lost by sublimation, or problems such as warpage may occur due to plastic deformation of AlN. Accordingly, the heat treatment temperature is preferably 2350° C. or less, more preferably 2300° C. or less. The heat treatment temperature and the holding time relate to the thickness of the AlN single crystal layer generated by epitaxial growth and can be appropriately adjusted.

However, in the case of using a formed body fabricated in advance as an oriented precursor layer, sintering is necessary during the heat treatment, and atmospheric firing at high temperature, hot pressing, HIP, or combinations thereof are suitable. For example, in the case of using hot pressing, the face pressure is preferably 50 kgf/cm² or more, more preferably 100 kgf/cm² or more, particularly preferably 200 kgf/cm² or more, and there is no particular upper limit. Further, the firing temperature is not specifically limited, as long as sintering and epitaxial growth occur, but is preferably 1700° C. or more, more preferably 1800° C. or more, further preferably 2000° C. or more. The atmosphere during firing can be selected from vacuum, nitrogen, or mixed gas of nitrogen and inert gas. The AlN powder that is a raw material is preferably composed of AlN particles having an average particle size of 0.01 to 5 μm. The average particle size refers to an average obtained by observing the powder with a scanning electron microscope and measuring the unidirectional maximum diameters of 100 primary particles.

(c) Step of Exposing Surface of Oriented Layer (See FIG. 2(*c*))

On the first layer 10 fabricated by steps (a) and (b) above, the oriented precursor layer 11 or a poorly oriented or non-oriented surface layer may be present or remain. In this case, it is preferable to expose the surface of the oriented layer by applying processing such as grinding or polishing to the face on the side derived from the oriented precursor layer 11, as required. Thereby, the material having excellent orientation is exposed on the surface of the first layer, so that the semiconductor layer can be effectively epitaxially grown thereon. The technique for removing the oriented precursor layer 11 or the surface layer is not specifically limited, but a technique of grinding and polishing and a technique of ion beam milling can be mentioned, for example. The surface of the first layer is preferably polished by lapping and chemical mechanical polishing (CMP) using abrasive grains.

(d) Formation of Third Layer 30 (See FIG. 2(d))

The surface of the second layer 20 opposed to the first layer 10 formed on the second layer 20 is subjected to steps (a) to (c) above again so that the third layer 30 can be formed. That is, an oriented precursor layer (not shown) is formed in the same manner as in step (a) above, and the third layer 30 is formed in the same manner as in step (b) above, on the surface of the second layer 20 opposed to the first layer 10 formed on the second layer 20, and the surface of the oriented layer can be exposed in the same manner as in step (c) above, as required.

In steps (a) to (d) above, i) the oriented precursor layer 11 is formed on the AlN single crystal 20, followed by heat treatment, so that the first layer 10 is formed, and then ii) another oriented precursor layer (not shown) is formed on the surface of the AlN single crystal 20 opposed to the first layer, followed by heat treatment, so that the third layer 30 can be formed, for example. Then, when the AlN single crystal 20 is used as the second layer 20, the AlN single crystal substrate 40 in which the first layer 10 and the third layer 30 are formed on both sides of the second layer 20 is obtained.

In this way, a method in which the first layer 10 is formed on the second layer 20, and then the third layer 30 is formed on the surface of the second layer 20 opposed thereto is conceivable. However, an oriented precursor layer may be formed on each of both sides of the second layer 20, and the first layer 10, the third layer 30 may be simultaneously formed by (b) heat treatment step at once, and such a method is preferable in consideration of the cost and the quality such as warpage of the AlN single crystal substrate to be obtained. Further, the c-axis-oriented AlN single crystal first prepared may be used as the third layer 30, and an AlN single crystal may be formed on one surface thereof in the order of the second layer 20 and the first layer 10. The method for producing an AlN single crystal substrate is not limited as long as the numerical range of the predetermined defect density is satisfied.

In the AlN single crystal substrate of the present invention, the method for forming each layer is preferably controlled so that the relationships of the defect densities of the first layer 10, the second layer 20, and the third layer 30 are satisfied. As mentioned above, for example, in the case where an oriented precursor layer is formed using a technique such as sputtering, sublimation, the HVPE method, various CVD methods, the MBE method, the PLD method, and the solution growth method, epitaxial growth occurs on the base (for example, on the AlN single crystal 20 or the SiC single crystal substrate) without undergoing (b) heat treatment step, so that an AlN single crystal layer may be formed, depending on the conditions. Such a technique enables formation of an oriented precursor layer and heat treatment, which is preferable in view of the production cost. However, the crystallinity of the AlN single crystal layer to be obtained is easily affected by the base layer.

In the case where the AlN single crystal layer is directly formed, the defect density can be gradually reduced as the AlN single crystal layer grows. Although the reason is not clear, it is presumed that pair annihilation of defects tends to proceed with the crystal growth. However, in the case of using such a technique, if the AlN single crystal layer is thin, since the defect density of the base layer is likely to be inherited, it is necessary to grow the AlN single crystal layer thick in order to reduce the defect density.

Meanwhile, even when using sputtering, sublimation, and the like, an oriented precursor layer having no orientation or a low degree of orientation can be obtained by controlling the film forming conditions such as the film forming temperature and the temperature gradient to make epitaxial growth difficult. When such an oriented precursor layer is crystal-grown in a heat treatment step using the base single crystal layer (for example, the AlN single crystal 20) as a seed, defects in the AlN single crystal layer to be obtained (for example, the first layer) can be effectively reduced. Although the reason is not clear, it is considered that the occurrence of rearrangement of the crystal structure using the AlN single crystal as a seed in the solid phase oriented precursor layer once formed may be effective in eliminating defects. Therefore, when forming an AlN single crystal layer with significantly fewer defects than the base layer, it is preferable to select the conditions that do not cause epitaxial growth in the step of forming the oriented precursor layer. Further, the defect density can be increased by introducing impurities or heterogenous phases into the AlN single crystal layer by controlling the composition of the oriented precursor layer, ion implantation, or the like. Examples of the impurities to be introduced include Mg, Al, N, Si, H, C, W, B, Zn, Ti, Be, and Ca, preferably Mg, Al, N, and Si. In addition, the defect density can be increased also by decreasing the heat treatment temperature during the heat treatment step (b).

In order to fabricate the AlN single crystal substrate of the present invention, it is preferable to appropriately control the relationships of the defect densities of the first layer 10, the second layer 20, and the third layer 30 by combining the techniques as mentioned above.

EXAMPLES

The present invention will be described further specifically by way of the following examples.

Example 1

(1) Fabrication of AlN Single Crystal Substrate (1a) Fabrication of AlN Single Crystal Using a crucible as a crystal growth vessel, a SiC substrate is placed within the crucible as a base material, and an AlN raw material powder was put therein so as not to be in contact with this. The growth vessel was pressurized at 50 kPa under $N_2$ atmosphere, and the part of the growth vessel near the AlN raw material powder is heated to 2100° C. by high-frequency induction heating while the part of the growth vessel near the SiC substrate is heated to a lower temperature (temperature difference $\Delta T=200°$ C.) and held, to reprecipitate AlN on the SiC substrate. The holding time was set to 10 hours. After the SiC substrate with AlN reprecipitated was ground using a grindstone of count up to #2000 until the AlN single crystal was exposed, the plate face was further smoothed by lapping using diamond abrasive grains. Thereafter, it was mirror-finished by chemical mechanical polishing (CMP) using colloidal silica. Thus, the AlN single crystal was fabricated. At this time, the face of the AlN single crystal on the side in contact with SiC was the back surface, and the face opposed to the back surface was the front surface. When EBSD measurement was conducted on the front and back surfaces of this AlN single crystal, the AlN crystal was oriented in both the c-axis direction and the a-axis direction.

(1b) Fabrication of AlN Layer on Front Surface Side

Using a crucible as a crystal growth vessel, the AlN single crystal obtained in step (1a) above is placed within the crucible as a base material, the AlN raw material powder was put therein so as not to be in contact with this. The AlN single crystal was placed so that the front surface thereof is exposed to the AlN raw material powder. The growth vessel was pressurized at 50 kPa under $N_2$ atmosphere, and while the part of the growth vessel near the AlN raw material powder is heated to 2100° C. by high frequency induction heating, the part of the growth vessel near the AlN single crystal is heated to a lower temperature (temperature difference $\Delta T=200°$ C.) and held for 40 hours, to form an AlN layer on the front surface of the AlN single crystal. Further, the back surface of the AlN single crystal was ground and polished in a predetermined amount, as shown in Table 1, to a desired thickness.

(1c) Fabrication of AlN Layer on Back Surface Side

An AlN layer was formed on the AlN single crystal including the AlN layer obtained in step (1b) above in the same manner as in step (1b) above except that the AlN single crystal was placed in the crucible in the state where the opposite face of the face of the AlN single crystal on which the AlN layer was formed, that is, the back surface was exposed. Thus, an AlN single crystal substrate with an AlN layer formed on each of the front and back surfaces of AlN single crystal was obtained.

Examples 2 to 5 and 8

An AlN single crystal substrate was fabricated in the same manner as in Example 1, except that the holding time in steps (1b) and (1c) above and the amount polished in step (1b) above were changed as shown in Table 1.

Example 6 (Comparison)

An AlN single crystal was fabricated in the same manner as in step (1a) above, and an AlN layer was formed further thereon in the same manner as in step (1b) above without grinding the back surface (however, the AlN layer was polished), and an AlN layer was formed further on the AlN layer in the same manner as in step (1b) above, in addition. The holding time, and the amount of the AlN layer formed immediately above the AlN single crystal polished were changed as shown in Table 1. Thus, an AlN single crystal substrate in which AlN layers were formed on the front surface of the AlN single crystal in two steps was obtained.

Example 7 (Comparison)

An AlN single crystal substrate was fabricated in the same manner as in Example 1, except that the holding time in step (1a) above was changed to 25 h, the holding time in steps (1b) and (1c) above and the amount polished in step (1b) above were changed as shown in Table 1.

(2) Evaluation of AlN Single Crystal Substrate (2a) Defect Density of Each Layer Example 1

The entire regions of the front and back surfaces of the AlN single crystal substrate obtained were measured by X-ray topography (XRTmicron, available from Rigaku Corporation), as a result of which the defect density on the front surface was $1.0\times10^4$ cm$^2$, and the defect density on the back surface was $1.0\times10^4$ cm$^2$. Then, after polishing 30 μm from the front surface, the entire region was mixed a weight ratio of KOH:NaOH=1:1 and the polished front surface was immersed in a melt heated to 450° C. for 5 minutes, followed by etching, to measure the defect density with an optical microscope. The defect density distribution inside the AlN single crystal was evaluated by repeating this, as a result of which the maximum value of the defect density was $8.0\times10^5$ cm$^{-2}$. The defect density inside the AlN single crystal was 10 times or more higher than the defect density of each of the front and back surfaces, and it was determined to have a three-layer structure including a second layer with high defect density. The maximum defect density inside the AlN single crystal was taken as the defect density of the second layer. Since the thickness from the face with the maximum defect density to the face with a defect density of 1/10 of the defect density was 30 μm on the front side and 30 μm on the back side, a 60 μm region including the face with the maximum defect density was defined as the second layer, a region from the second layer to the layer on the front side was defined as the first layer, and a region from the second layer to the layer on the back side was defined as the third layer. Table 1 shows the defect densities of the first to third layers and a ratio of the thickness of the second layer to the thickness of the AlN single crystal substrate.

Examples 2 to 5

Measurement was performed in the same manner as in Example 1. Table 1 shows the defect densities of the first to third layers and a ratio of the thickness of the second layer to the thickness of the AlN single crystal substrate.

Example 6 (Comparison)

Measurement was performed in the same manner as in Example 1. The defect density obtained was confirmed, as a result of which the front surface was $1.0\times10^4$ cm$^{-2}$, and the back surface was $1.0\times10^6$ cm$^{-2}$, and the maximum value inside the AlN single crystal was $8.0\times10^5$ cm$^{-2}$. The maximum value of the internal defect density was not 10 times or more the defect density of each of the front and back surfaces, so it turned out that it did not have a three-layer structure like the AlN single crystal substrate of the present invention.

Example 7 (Comparison)

Measurement was performed in the same manner as in Example 1. The defect density obtained was confirmed, as a result of which the front surface was $4.0 \times 10^4$ cm$^2$, and the back surface was $4.0 \times 10^4$ cm$^{-2}$, and the maximum value inside the AlN single crystal was $1.0 \times 10^5$ cm$^{-2}$. The maximum value of the internal defect density was not 10 times or more the defect density of each of the front and back surfaces, so it turned out that it did not have a three-layer structure like the AlN single crystal substrate of the present invention.

Example 8

Samples with a film thickness of 300 to 400 nm were sampled by focused ion beam (FIB) processing in a 50 µm×50 µm region including the center of gravity on the front (2b) Confirmation of Cracks It was visually confirmed whether or not cracks occur when the AlN single crystal substrate was processed in the post-process. The "post-process" generally includes steps of slicing, cutting, dicing, grinding, and polishing the face (first layer) used for epitaxial growth of a semiconductor film for deep ultraviolet light emitting elements so that a desired semiconductor film was obtained and a step of actually fabricating deep ultraviolet light emitting elements. As the post-process, the surface of the first layer was subjected to grinding, polishing, and dicing. This post-process was performed on 10 AlN single crystal substrates in total. These 10 substrates were graded and evaluated according to the following criteria. Table 1 shows the results.

<Evaluation Criteria>

Evaluation A: 9 to 10 AlN single crystal substrates had no cracks

Evaluation B: 6 to 8 AlN single crystal substrates had no cracks

Evaluation C: 3 to 5 AlN single crystal substrates had no cracks

Evaluation D: All AlN single crystal substrates had cracks

TABLE 1

|  | Surface heating holding time (h) in (1b) | Back surface heating holding time (h) in (1c) | Back surface polishing amount in (1b) (µm) | Defect density (/cm²) | | | Thickness of second layer (µm) | Ratio of thickness of second layer to thickness of AlN single crystal substrate | The number of cracks |
|---|---|---|---|---|---|---|---|---|---|
|  |  |  |  | First layer (Front surface) | Second layer (Inside) | Third layer (Back surface) |  |  |  |
| Ex. 1 | 40 | 40 | 1900 | $1.0 \times 10^4$ | $8.0 \times 10^5$ | $1.0 \times 10^4$ | 60 | 0.05 | C |
| Ex. 2 | 40 | 40 | 1850 | $1.0 \times 10^4$ | $8.0 \times 10^5$ | $1.0 \times 10^4$ | 90 | 0.08 | C |
| Ex. 3 | 40 | 40 | 1700 | $1.0 \times 10^4$ | $8.0 \times 10^5$ | $1.0 \times 10^4$ | 180 | 0.17 | C |
| Ex. 4 | 40 | 50 | 200 | $1.0 \times 10^4$ | $2.0 \times 10^7$ | $1.0 \times 10^4$ | 60 | 0.05 | B |
| Ex. 5 | 40 | 50 | 100 | $1.0 \times 10^4$ | $2.0 \times 10^9$ | $1.0 \times 10^4$ | 60 | 0.05 | A |
| Ex. 6* | 20 | 20** | 500* | $1.0 \times 10^4$ | $8.0 \times 10^5$ | $1.0 \times 10^6$ | — | — | D |
| Ex. 7* | 25 | 25 | 4900 | $4.0 \times 10^4$ | $1.0 \times 10^5$ | $4.0 \times 10^4$ | — | — | D |
| Ex. 8 | 50 | 60 | 100 | $<8.0 \times 10^3$ | $2.0 \times 10^9$ | $<8.0 \times 10^3$ | 60 | 0.05 | A |

The symbol * represents a comparative example.
The symbol ** represents the heating holding time when an AlN layer is further formed on the AlN layer.
The symbol *** represents the polishing amount of the AlN layer formed directly on the AlN single crystal.

and back surfaces of the AlN single crystal substrate and 50 µm×50 µm regions at four other locations. Thereafter, the defect density was measured and evaluated by TEM (H-9000UHR, available from Hitachi High-Tech Corporation). Since no defects were observed on both the front and back surfaces, both regions were below the detection limit, that is, the defect density was less than $8.0 \times 10^3$ cm$^2$. Then, when the defect density distribution inside the AlN single crystal was evaluated in the same manner as in Example 1, as a result of which the face with a defect density of $2.0 \times 10^9$ cm$^{-2}$ (face with the highest defect density) that was 10 times or more the defect density of each of the front and back surfaces was observed. Further, since the defect densities on the face of 30 µm on the front side and 30 µm on the back side in the thickness direction from that face were each a defect density of 1/10 the highest defect density, it turned out that the thickness of the second layer was 60 µm. Table 1 shows the defect densities of the first to third layers and a ratio of the thickness of the second layer to the thickness of the AlN single crystal substrate.

What is claimed is:

1. An AlN single crystal substrate that has a three-layer structure composed of one AlN single crystal as a whole and that is classifiable into a first layer, a second layer, and a third layer in this order in a thickness direction in terms of defect density,
   wherein a defect density of the second layer is 100 times or more than a defect density of each of the first layer and the third layer.

2. The AlN single crystal substrate according to claim 1, wherein the defect density of the second layer is 1000 times or more than the defect density of each of the first layer and the third layer.

3. The AlN single crystal substrate according to claim 1, wherein the defect density of each of the first layer and the third layer is $1.0 \times 10^5$/cm$^2$ or less.

4. The AlN single crystal substrate according to claim 1, wherein the defect density of each of the first layer and the third layer is $1.0 \times 10^4$/cm$^2$ or less.

5. The AlN single crystal substrate according to claim 1, wherein a ratio of a thickness of the second layer to a thickness of the AlN single crystal substrate is 0.02 to 0.28.

6. The AlN single crystal substrate according to claim 1, wherein a ratio of a thickness of the second layer to a thickness of the AlN single crystal substrate is 0.02 to 0.18.

7. The AlN single crystal substrate according to claim 1, wherein a thickness of the second layer is 1.0 to 70 μm.

* * * * *